US007488220B2

(12) United States Patent
Suzuki

(10) Patent No.: US 7,488,220 B2
(45) Date of Patent: Feb. 10, 2009

(54) ELECTRICAL CONNECTOR WITH LOCKING MECHANISM

(75) Inventor: Kenji Suzuki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/984,493

(22) Filed: Nov. 19, 2007

(65) Prior Publication Data

US 2008/0119075 A1 May 22, 2008

(30) Foreign Application Priority Data

Nov. 20, 2006 (JP) ............................ 2006-313091

(51) Int. Cl.
*H01L 21/302* (2006.01)

(52) U.S. Cl. ...................................... 439/752; 439/686

(58) Field of Classification Search ................. 439/752, 439/595, 686, 701, 594

See application file for complete search history.

(56) References Cited

U.S. PATENT DOCUMENTS

| | | | | |
|---|---|---|---|---|
| 4,425,018 | A * | 1/1984 | Stenz | 439/716 |
| 4,580,861 | A * | 4/1986 | Kaley | 439/594 |
| 6,193,550 | B1 * | 2/2001 | Yamashita et al. | 439/594 |
| 6,332,813 | B1 * | 12/2001 | Okabe et al. | 439/701 |
| 6,447,344 | B2 * | 9/2002 | Sato et al. | 439/701 |
| 6,592,411 | B2 * | 7/2003 | Mase et al. | 439/752 |
| 6,835,105 | B1 * | 12/2004 | Nakamura et al. | 439/752 |
| 6,851,987 | B2 * | 2/2005 | Mase et al. | 439/752 |
| 6,881,100 | B2 * | 4/2005 | Barry et al. | 439/701 |
| 7,281,961 | B1 * | 10/2007 | Sugiyama et al. | 439/752 |
| 2002/0168895 | A1 * | 11/2002 | Suzuki | 439/595 |
| 2002/0197915 | A1 * | 12/2002 | Mase et al. | 439/752 |
| 2003/0114049 | A1 * | 6/2003 | Milan | 439/701 |
| 2003/0148669 | A1 * | 8/2003 | Ishikawa et al. | 439/752 |

FOREIGN PATENT DOCUMENTS

| | | | | |
|---|---|---|---|---|
| GB | 2432466 | A | * | 5/2007 |
| JP | 2007173216 | A | * | 7/2007 |

* cited by examiner

*Primary Examiner*—T C Patel
*Assistant Examiner*—Harshad C Patel
(74) *Attorney, Agent, or Firm*—Edwards Angell Palmer & Dodge LLP

(57) ABSTRACT

A protective bridge is provided between a pair of side covers on a rear side of an outer housing in an inserting direction of a terminal so that the protective bridge is nearer to an inner housing in a mounting direction than a terminal receiving chamber is when the inner housing is in a provisional locking position with the outer housing. A beam formed on a rear part of the inner housing protrudes downwards in the mounting direction so that the protective bridge overlaps the beam when the inner housing is locked with the outer housing. The protective bridge and the beam have a first retaining protrusion and a second retaining protrusion, respectively, by virtue of which full locking between the inner housing and the outer housing can be made more reliable.

3 Claims, 11 Drawing Sheets

ELECTRICAL CONNECTOR WITH LOCKING MECHANISM

CROSS REFERENCE TO RELATED APPLICATIONS

The priority application Japan Patent Application No. 2006-313091 upon which this patent application is based is hereby incorporated by reference.

BACKGROUND OF THE INVENTION

1. Field of the Invention

This invention relates generally to a connector and, more particularly, to a connector which includes a connector housing having a terminal locking lance for firstly retaining a terminal, and a spacer for secondly retaining the terminal, wherein the spacer is mounted into the connector housing from a direction crossing at right angles an inserting direction in which the terminal is inserted into the connector housing.

2. Description of the Related Art

Thus far, as the connector described above, for example, a connector shown in FIGS. 15A, 15B, 16A, and 16B is known (Japanese Patent Laid-Open No. 2005-336897 which has been invented by the inventor of the present invention). This conventional connector includes two primary parts, i.e., an inner housing 10 and an outer housing 20.

The inner housing 10 has terminal receiving chambers 11 and terminal locking lances 12. The terminal locking lance 12 locks the terminal 30 that is received in the terminal receiving chamber 11.

The outer housing 20 has a spacer 21, a front portion 22, and a pair of side covers 23, each of which is formed integrally with the outer housing 20. The spacer 21 of the outer housing is mounted to the inner housing 10 in a mounting direction Y2 which is at right angles to an inserting direction Y1 in which the terminals 30 are inserted into the inner housing. The inner housing 10 is locked with the spacer 21 in a provisional locking position and in a complete locking position.

A front portion 22 covers the front part of the inner housing 10 and has mating-terminal-insertion holes 24 which communicate with the corresponding terminal receiving chambers 11. The pair of the side covers 23 are two sides of the outer housing 20 and are provided perpendicularly to a bottom of the outer housing 20.

The pair of the side covers 23 have a provisional locking groove 25 and a full locking groove 26. A locking projection 13 is provided on a side surface of the inner housing 10. The provisional locking groove 25 retains ad interim the locking projection 13 while the spacer 21 is in the provisional locking position. The full locking groove 26 retains the locking projection 13 while the spacer 21 is in the complete locking position.

Unfortunately, since there exists a small gap (indicated by S in FIG. 15B) between the inner housing 10 and the outer housing 20 of the conventional connector (see FIG. 15B), an electric wire may be caught by a corner of a rear side of the side cover 23, causing the outer housing 20 to be turned up, which as a result may cause accidental exit from a state of locking between the inner housing 10 and the outer housing 20 and damage or breakage to the side cover 23.

In addition, since full locking between the inner housing 10 and the outer housing 20 is only achieved by the locking projection 13 of the inner housing 10 and the full locking groove 26 of the outer housing 20, the full locking is not sufficiently reliable. Consequently, when a force F is applied downwardly in the mounting direction Y2 upon an electric wire 40, there will be looseness (indicated by L in FIG. 16B) between the full locking groove 26 and the locking projection 13 or the inner housing 10 and the outer housing 20 may be accidentally taken out of the state of locking with each other (see FIGS. 16A and 16B).

SUMMARY OF THE INVENTION

In view of the foregoing background, an object of the present invention is to provide a connector capable of protecting a housing cover against being turned up or other damage or breakage and ensuring firm locking between a connector housing and a housing cover.

In order to attain the above objective, the present invention is to provide a connector which includes: (A) an inner housing having a terminal receiving chamber and a terminal locking lance that retains a terminal received in the terminal receiving chamber; and (B) an outer housing which is locked with the inner housing in a mounting direction (at right angles to an inserting direction in which the terminal is inserted into the inner housing), and includes: (a) a pair of side covers covering sides of the inner housing; (b) a spacer locked with the inner housing in a provisional locking position where the terminal is allowed to be received into the terminal receiving chamber and in a complete locking position where the terminal is fully and firmly retained and protected against unexpected or accidental disengagement from the terminal receiving chamber; and (c) a connecting portion provided on a rear part of the outer housing and connecting between the pair of the side covers.

With the configuration described above, since the connecting portion is provided around a lower region of the rear part of the outer housing so as to connect between the pair of the side covers of the outer housing, an electric wire is protected against being accidentally caught in a gap between the outer housing and the inner housing from around a corner of the side cover. In addition, the side covers connected to each other via the connecting portion is protected against being taken out of a state of engagement, being turned up, or against other damage or breakage. Further, even when a force is applied upon the electric wire downwards in a mounting direction in which the state of locking between the inner housing and the outer housing is accidentally exited, stress will not act upon the inner housing downwards in the mounting direction due to the electric wire being caught by the connecting portion.

Preferably, the connector of the present invention includes a locking mechanism provided on the rear part of the inner housing for retaining the connecting portion of the outer housing in the complete locking position.

With the configuration described above, since the locking mechanism of the inner housing locks the connecting portion of the outer housing in the complete locking position, more secure and reliable locking is achieved between the inner housing and the outer housing, thus preventing accidental disengagement between the inner housing from the outer housing.

Preferably, the locking mechanism of the inner housing includes a locking projection protruding from a rear part of the inner housing, a projecting portion is protrudingly provided on the rear part of the inner housing, the connecting portion of the outer housing includes a recess portion engaging the projecting portion of the inner housing, a width of said projecting portion nearer to said rear part of said inner housing is larger than a width of said projecting portion nearer to a front part of said inner housing, and a width of said recess portion nearer to said rear part of said outer housing is larger than a width of said recess portion nearer to a front part of said outer housing.

With the configuration described above, deformation of the connecting portion is prevented by virtue of the projecting portion engaging the recess portion even when a stress is applied upon the rear end of the inner housing when mounting the inner housing into the outer housing, which helps maintain an engagement margin of the locking projection with the connecting portion, and strengthen the locking between the inner housing and the outer housing, and thus unexpected or accidental exit from the locked state between the inner housing from the outer housing can be effectively avoided.

BRIEF DESCRIPTION OF THE DRAWINGS

These and other objects, features, and advantages of the present invention will become more apparent upon reading of the following detailed description along with the accompanied drawings, in which.

DESCRIPTION OF THE PREFERRED EMBODIMENTS

First Embodiment

The first embodiment of the present invention is described with reference to FIGS. 1 to 7.

Figure 1:
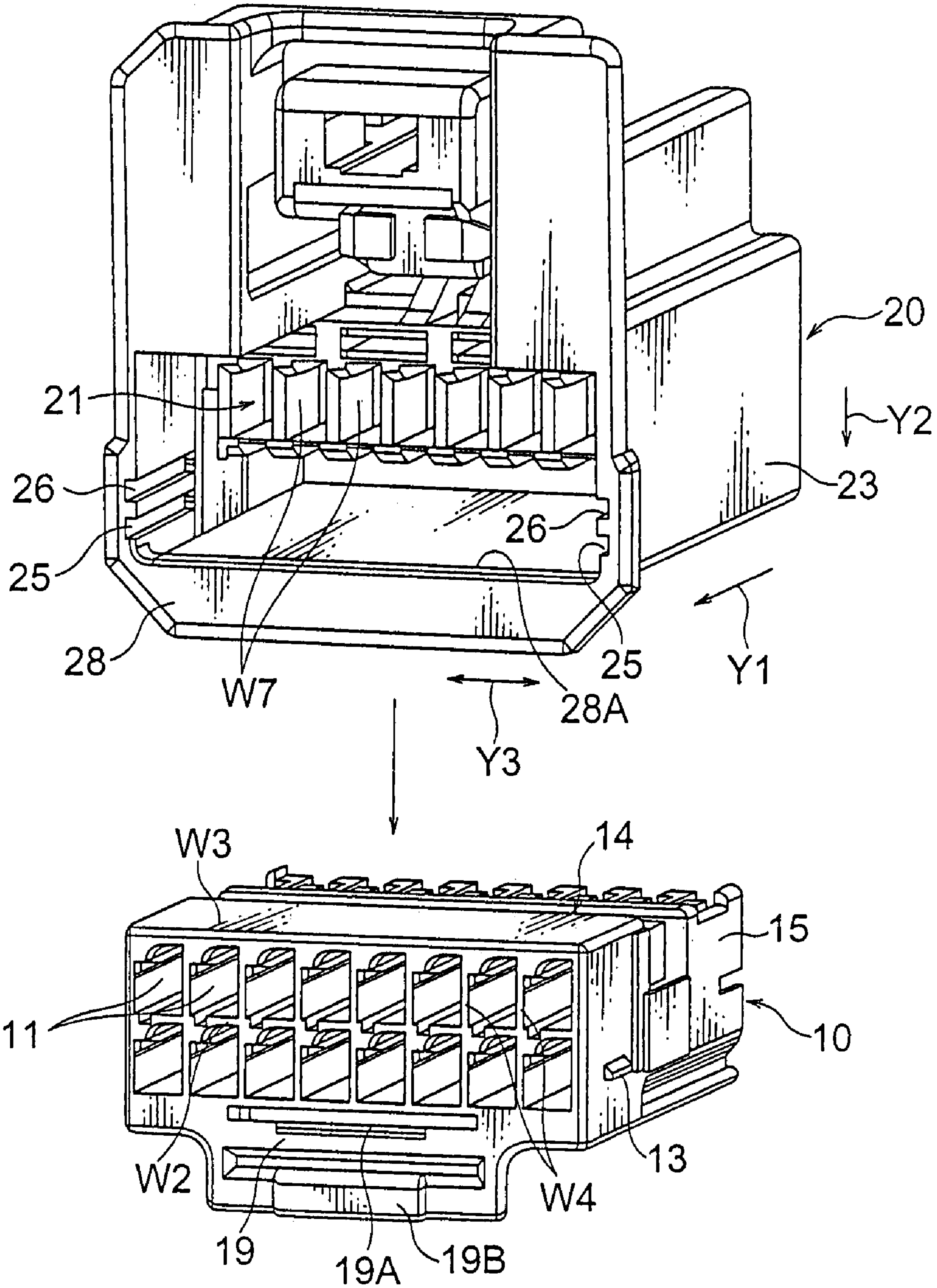
FIG. 1 is an exploded perspective view of a connector of the present invention according to a first embodiment, showing an inner housing and an outer housing.
Figure 2:
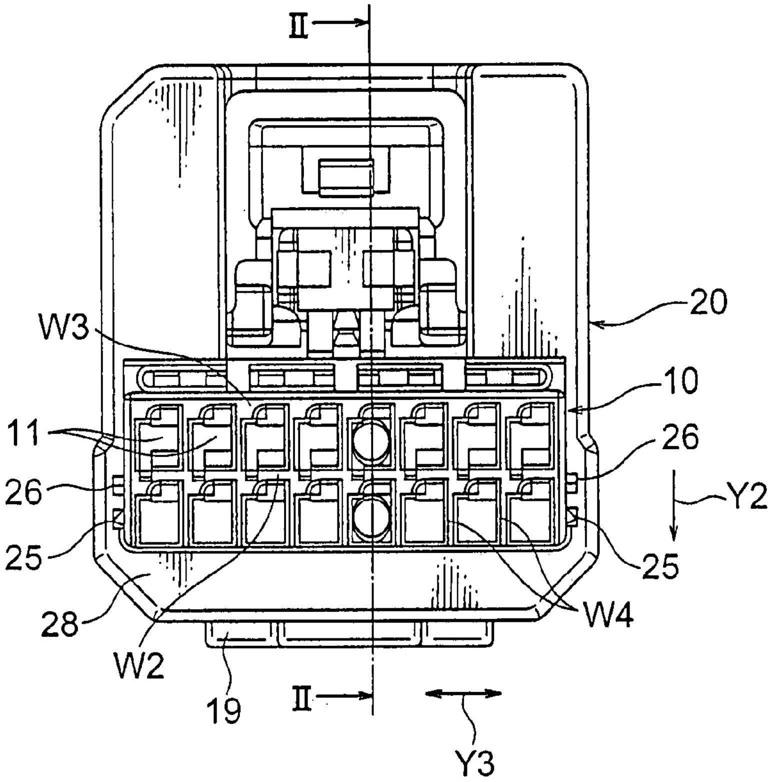
FIG. 2 is a rear view of the connector of FIG. 1 in a provisional locking position.
Figure 3:
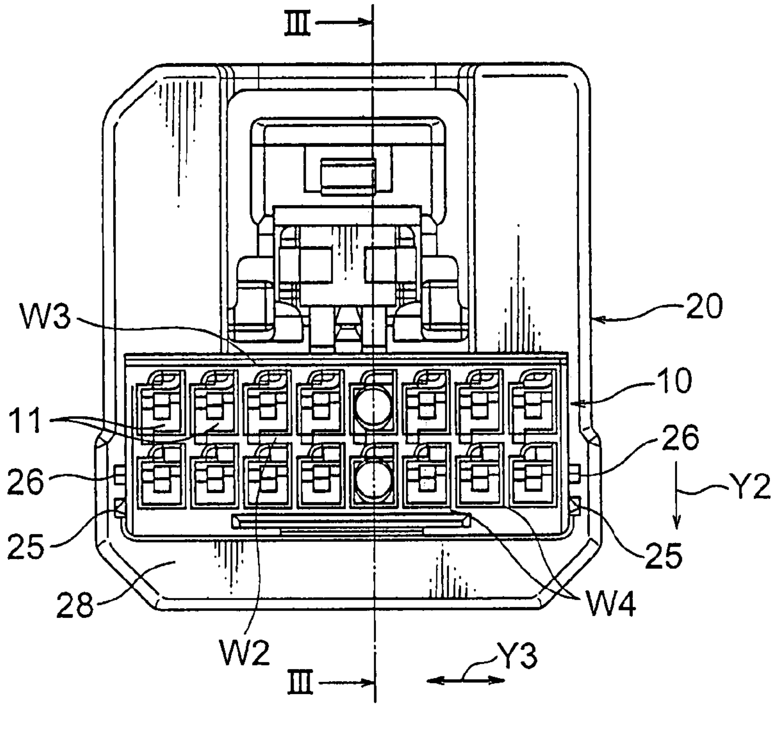
FIG. 3 is a rear view of the connector of FIG. 1 in a complete locking position.

Referring to FIG. 1, the connector has an inner housing 10 made of synthetic resin and an outer housing 20 made of synthetic resin. First, let us discuss the inner housing 10. Note that the FIG. 1 shows the inner housing and the outer housing viewed from a rear side. Accordingly, a proximal side and a distal side of the outer housing or the inner housing correspond to a rear and a front part of the outer housing or the inner housing, respectively.

The inner housing 10 is approximately box-shaped. The inner housing 10 has two rows of terminal receiving chambers 11 arranged heightwise. Each of the rows includes eight terminal receiving chambers 11. The outer housing 20 is moved into locking with the inner housing 10 in the mounting direction Y2 which is perpendicular with respect to an inserting direction Y1 in which a terminal 30 is inserted into the inner housing 10 (see FIGS. 4 and 5). As used herein, the mounting direction is a direction in which the outer housing 20 is locked with the inner housing 10. The terminals 30 are female-type and inserted into the terminal receiving chambers 11 from a rear end (a proximal end in FIG. 1) of the inner housing 10 along the inserting direction Y1 (see FIGS. 4 and 5).

In addition, the inner housing 10 also has an engagement groove 14. The engagement groove 14 which is provided on an intermediate region of the inner housing 10 in the inserting direction Y1 extends on a surface of the inner housing 10 in a width direction Y3. A spacer 21 (described later on) of the outer housing 20 is brought into engagement with the engagement groove 14. Note that the width direction is at right angles with the inserting direction Y1 and the mounting direction Y2.

Figure 4:
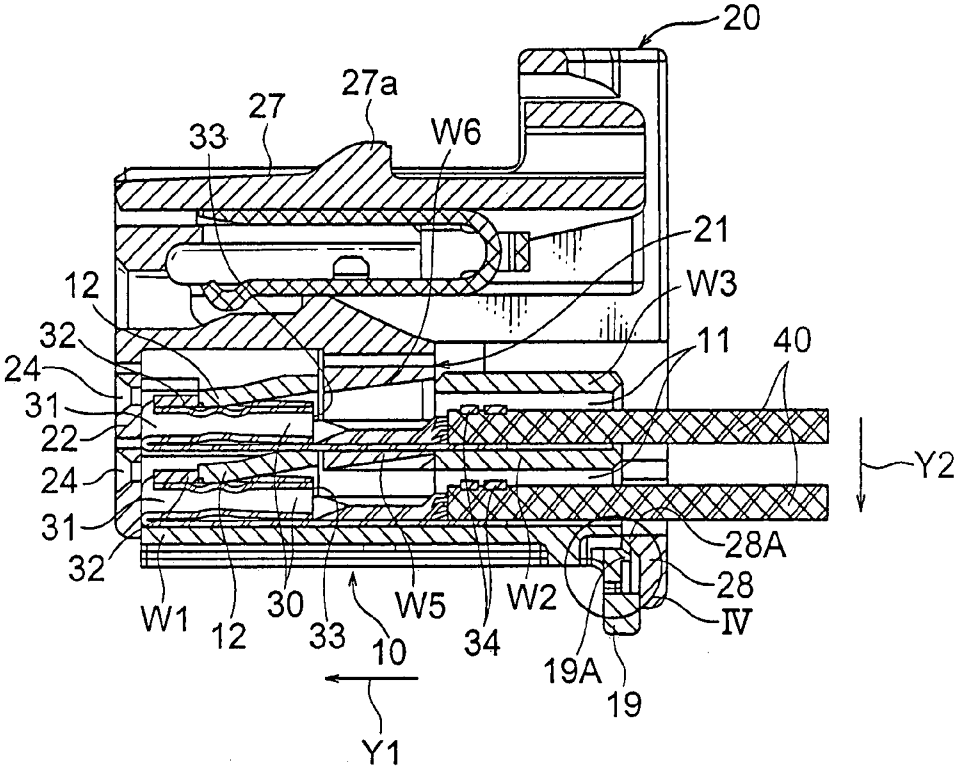
FIG. 4 is a cross-sectional view of the connector of FIG. 2 taken along the line of II-II.
Figure 5:
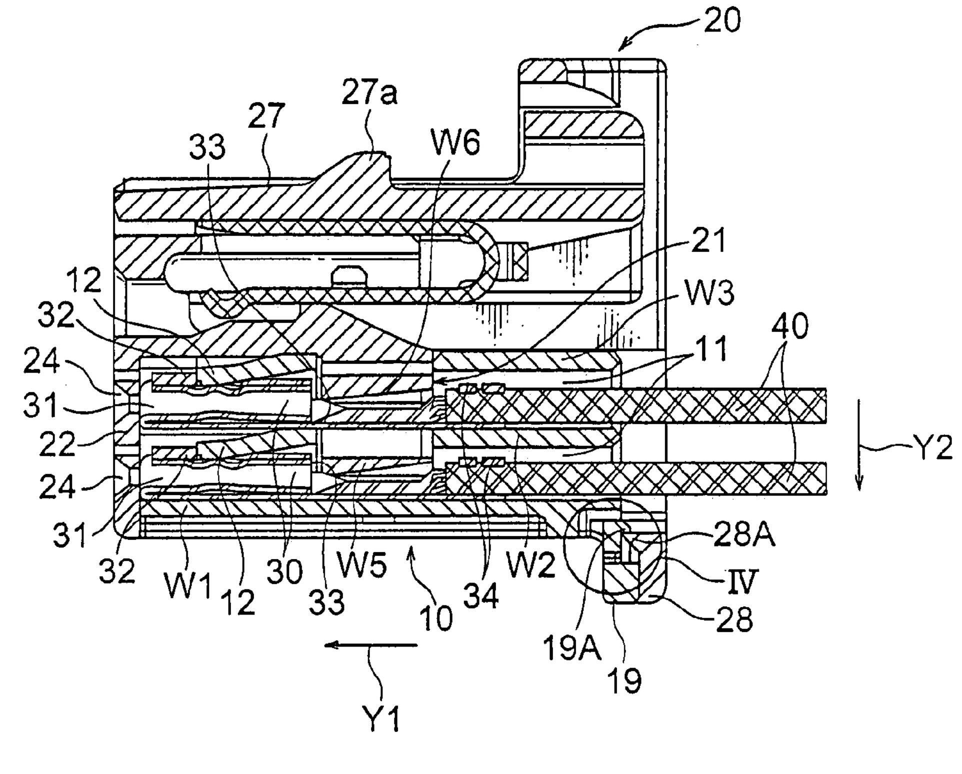
FIG. 5 is a cross-sectional view of the connector of FIG. 3 taken along the line of III-III.
Figure 6:
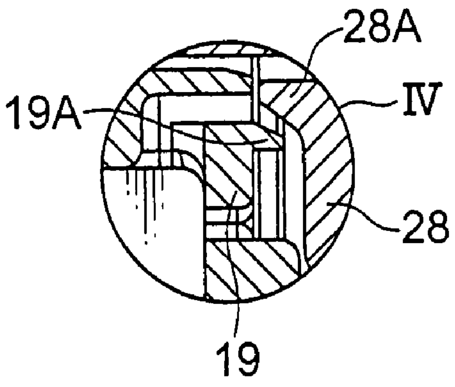
FIG. 6 is an enlarged view of circle IV in FIG. 4.
Figure 7:
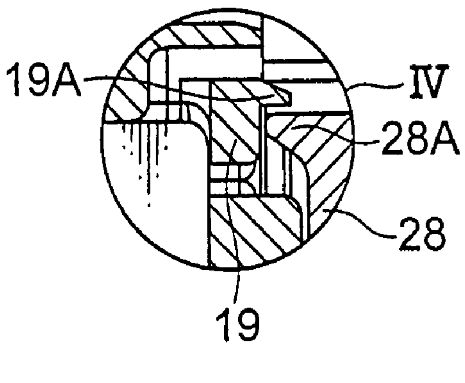
FIG. 7 is an enlarged view of circle V in FIG. 5.

Referring to FIGS. 4 and 5, the inner housing 10 also has a bottom wall W1 and resilient terminal locking lances 12. The terminal locking lance 12 is provided nearer to a front side of the terminal 30 than the engagement groove 14 is provided. The terminal locking lance 12 approaches the bottom wall W1 as advancing to the front part of the inner housing 10.

In addition to the bottom wall W1, the inner housing 10 also has a horizontal partition wall W2 and a top wall W3. The horizontal partition wall W2 and the top wall W3 are provided nearer to a rear side of the terminals 30 than the engagement groove 14 is provided. It is by virtue of the bottom wall W1, the horizontal partition wall W2, and the top wall W3 that the terminal receiving chambers 11 are arranged in an upper row and a lower row in the mounting direction Y2.

Referring again to FIG. 1, the inner housing 10 also has a pair of side portions 15 and a plurality of vertical partition walls W4. The pair of the side portions 15 are in parallel with each other and at right angles to a width direction Y3 which is at right angles to both of the inserting direction Y1 and the mounting direction Y2. A plurality of the vertical partition walls W4 are in parallel with the side portions 15.

The terminal receiving chambers 11 are arranged between the pair of the side portions 15. The terminal receiving chambers 11 are arranged in the width direction Y3 by the side portions 15 and the vertical partition walls W4. Locking projections 13 are formed on each outer surface of the side portions 15 of the inner housing 10. The locking projection 13 is brought into engagement with a provisional locking groove 25 and a full locking groove 26 of the outer housing 20.

Turning now to the features of the outer housing with reference to FIGS. 4 and 5, a front portion 22, a side cover 23, a locking arm 27, and a spacer 21 are provided on and formed integrally with the outer housing 20. The front portion 22 (corresponding to the distal side of the outer housing 20 in FIG. 1) covers a front side of the inner housing 10. Mating-terminal-insertion holes 24 for insertion of mating male terminals are formed on the front portion 22. The mating-terminal-insertion hole 24 communicates with the corresponding terminal receiving chamber 11.

The side cover 23 covers the side portion 15 of the inner housing 10. The provisional locking groove 25 and the full locking groove 26 are formed on an inner surface of the side cover 23 (see FIG. 1). As shown in FIGS. 4 and 5, the locking arm 27 has a locking protrusion 27A which locks a mating connector housing (not shown).

Still referring to FIG. 1, the provisional locking groove 25 and the full locking groove 26 extend from the rear end of the inner surface of the side cover 23 of the outer housing along the inserting direction Y1. The spacer 21 has a horizontal partition wall W5 and a top wall W6. The horizontal partition wall W5 and the top wall W6 partition an intermediate region of the terminal receiving chamber 11 in the mounting direction Y2. The spacer 21 has a plurality of vertical partition walls W7 that are horizontal with respect to the side cover 23. The vertical partition walls W7 partition the intermediate region of the terminal receiving chamber 11 in the width direction Y3.

Turning somewhat belatedly to the terminal 30 with reference to FIGS. 4 and 5, the terminal 30 has a cylindrical portion 31, a first locking step 32, a second locking step 33, and a crimping piece 34. The cylindrical portion 31 formed for example in an approximately rectangular shape receives the mating male terminal. The first locking step 32 is locked with the terminal locking lance 12 of the inner housing 10. The second locking step 33 is provided nearer to the rear side of the terminal 30 than the first locking step 32 is provided. The second locking step 33 is locked with the spacer 21. The crimping piece 34 is provided on the rear side when viewed from the second locking step 33. An electric wire 40 is caulk-fixed to the crimping piece 34.

As will be described later, the terminal 30 is inserted into the terminal receiving chamber along the inserting direction Y1. The inserting direction Y1 is at right angles to the mounting direction in which the outer housing 20 is locked with the inner housing 10.

Referring again to FIG. 1, the outer housing 20 has a plate-shaped protective bridge 28. The protective bridge 28 is provided between the pair of the side covers 23 to the rear side of the outer housing. The protective bridge 28, when observed along the mounting direction, as shown in FIG. 4, is nearer to the inner housing 10 than the terminal receiving chamber 11 in the provisional locking position. The protective bridge 28 has a first retaining protrusion 28A (corresponding to a locking mechanism of the present invention) provided along the width direction Y3.

Referring again to FIG. 1, the inner housing 10 has a plate-shaped beam 19 which is resilient in the inserting direction Y1 and downwardly protrudes in the mounting direction Y2 so that the plate-shaped protective bridge 28 overlaps the inner housing 10 when mounting the outer housing 20 to the inner housing 10. The beam 19 has a second retaining protrusion 19A (corresponding to the locking mechanism) along the width direction Y3. The second retaining protrusion 19A locks the first retaining protrusion 28A in the complete locking position.

As used herein, the provisional locking position is a state where the inner housing 10 is provisionally locked with the outer housing 20. Also, in the provisional locking position, the terminal 30 is allowed to be inserted into the terminal receiving chamber 11. Meanwhile, the complete locking position is a state where the provisional locking between the inner housing 10 and the outer housing 20 is fully and firmly maintained, and the terminal 30 is also fully and firmly retained in the terminal receiving chamber and protected against being accidentally disengaged from the terminal receiving chamber 11.

Now that we have described in detail the basic configuration and features of the connector of the present invention, the following is dedicated to how to assemble the above-described connector.

A process of assembling the connector can be roughly divided into three steps. A first step is to achieve the provisional locking between the inner housing 10 and the outer housing 20. A second step is insertion of the female-type terminals 30 firstly into the terminal receiving chambers 11 in the lower row, and then into the terminal receiving chambers 11 in the upper row. A third, final step is to achieve the full locking between the inner housing 10 and the outer housing 20.

To start with, the outer housing 20 is moved toward the inner housing 10 in the mounting direction Y2 and locked with the inner housing 10. At this point, the spacer 21 of the outer housing 20 is inserted into the engagement groove 14 of the inner housing 10. When the outer housing 20 is moved until the locking projection 13 of the inner housing 10 has been brought into provisional locking with the provisional locking groove 25 of the outer housing 20. Thus the provisional locking position is entered.

Referring to FIG. 4, at this provisional locking position, upper surfaces of the horizontal partition wall W2, the horizontal partition wall W5, and the terminal locking lance 12 have no difference in grade with respect to each other. In the provisional locking position, the spacer 21 is in such a position that the spacer 21 allows insertion of the terminals 30 into the terminal receiving chambers 11.

Next, the terminals 30 are inserted into the terminal receiving chambers 11 in the lower row. The terminals 30 are inserted into the terminal receiving chambers 11 from the rear end of the inner housing 10. Each terminal 30 is accommodated advancing toward a front end of the terminal receiving chamber 11 along the bottom wall W1. When the top end of the terminal 30 has reached the terminal locking lance 12, the terminal locking lance 12 is elastically deformed upwardly in the mounting direction Y2. When the top end of the terminal 30 has been further inserted past the terminal locking lance 12 toward the front part of the inner housing 10, the terminal locking lance 12 will be restored downwardly in the mounting direction Y2. Thus, the terminal locking lance 12 locks first locking step 32 of the terminal 30. The terminal 30 also enters the provisional locking position, where the terminals 30 are kept accommodated in the terminal receiving chamber 11.

Likewise, the terminals 30 are inserted into the upper terminal receiving chambers 11. The terminals 30 are inserted into the terminal receiving chamber 11 from the rear end of the inner housing 10. The terminals 30 are inserted toward the front end, passing above an upper surface of the horizontal partition wall W2 of the inner housing 10 and then an upper surface of the horizontal partition wall W5 of the spacer 21. When the top end of the terminal 30 has reached the terminal locking lance 12, the terminal locking lance 12 is elastically deformed upwardly in the mounting direction Y2. When the top end of the terminal 30 has reached the front side past the terminal locking lance 12, the terminal locking lance 12 is restored downwardly in the mounting direction Y2. Thus, the terminal locking lance 12 locks the first locking step 32 of the terminal 30 and thereby provisionally locks the terminal 30, and the terminal 30 is kept accommodated in the terminal receiving chamber 11.

Finally, the outer housing 20 is further pressed and moved in the mounting direction Y2. Then, locking between the provisional locking groove 25 of the outer housing 20 and the locking projection 13 of the inner housing 10 will be exited, and the locking projection 13 of the inner housing 10 will be locked with the full locking groove 26 of the outer housing 20.

Further, when the second retaining protrusion 19A of the inner housing 10 has reached the first retaining protrusion 28A of the outer housing 20 as a result of above-described operation of the outer housing 20, the beam 19 of the inner housing 10 is elastically deformed in the inserting direction Y1. When the outer housing 20 is further pressed downwards to be slid and the second retaining protrusion 19A is positioned on an upper side in the mounting direction Y2 viewed from the first retaining protrusion 28A, the beam 19 is restored in the inserting direction Y1 and the first retaining protrusion 28A is locked the second retaining protrusion 19A, thus resulting in entry into the complete locking position.

As shown in FIG. 5, the terminals 30 inserted into the upper terminal receiving chambers 11 are fully locked as the second locking step 33 of the terminals 30 locks the horizontal partition wall W5 and the top wall W6 of the spacer 21. Thus, in the complete locking position, the spacer 21 securely retains the terminals 30. By virtue of the spacer 21, the terminals 30 are held in the state of locking with the terminal receiving chambers 11 even when the state of locking of the terminals 30 by the terminal locking lance 12 is accidentally exited.

On the basis of the foregoing, we can obtain a schematic representation of the two state of locking which the connector of the present invention achieves. The complete locking position between the inner housing and the outer housing is achieved by the locking projection 13 of the inner housing 10 locked with the full locking groove 26 of the outer housing 20, and the first retaining protrusion 28A of the outer housing 20 locked with the second retaining protrusion 19A of the inner housing 10. In addition, the complete locking position of the terminal 30 is achieved by the spacer 21 of the outer housing retaining the terminal 30. In contrast, the provisional locking position is maintained by the locking projection 13 of the inner housing 10 locked with the provisional locking groove 25 of the outer housing 20.

Figure 8:
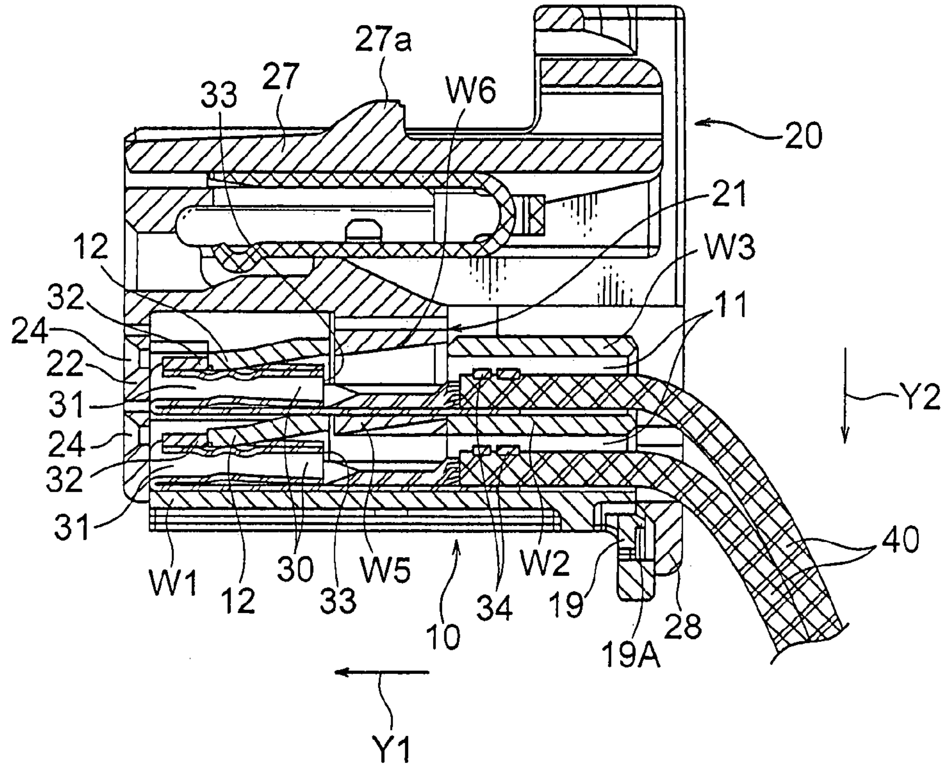
FIG. 8 is a cross-sectional view of the connector with a first retaining protrusion and a second retaining protrusion taken out of a state of locking with each other.

In the first preferred embodiment described above, the protective bridge 28 is provided between the pair of the side covers 23 on the rear end of the outer housing in the inserting direction Y1 so that, in the complete locking position, the protective bridge 28 is positioned closer to a bottom side in the mounting direction Y2 than the terminal receiving chamber 11 is. Consequently, even when the state of locking between the first retaining protrusion 28A and the second retaining protrusion 19A is accidentally exited, the electric wire 40 will not get caught by the protective bridge 28, the accidental exit from the state of locking between the outer housing 20 and the inner housing 10 can be avoided (see FIG. 8), and secure full locking between the inner housing 10 and the outer housing 20 is achieved. Since the gap S is controlled within a permissible range, the side cover 23 is protected against being turned up or damaged.

In addition, according to the above-described first embodiment, the beam 19 protrudes heightwise so that the protective bridge 28 overlaps the beam 19 when mounting the outer housing 20 to the inner housing 10. The first retaining protrusion 28A and the second retaining protrusion 19A are provided so that the protective bridge 28 and the beam 19 retain the inner housing 10 and the outer housing 20 in the complete locking position, respectively.

Since the first retaining protrusion 28A and the second retaining protrusion 19A are provided on the protective bridge 28 and the beam 19, respectively, the inner housing 10 and the outer housing 20 can be locked with each other on the nearer side in the mounting direction Y2 than the electric wire 40 on the rear end side of the inserting direction Y1 (see FIG. 5). Accordingly, the state of locking between the first retaining protrusion 28A and the second retaining protrusion 19A is not accidentally exited even when a force in the mounting direction Y2 is applied upon the electric wire 40.

Second Embodiment

The second embodiment of the present invention is described with reference to FIGS. 9 to 13. Although the features that have already been discussed as those pertaining to the first embodiment also appear in FIGS. 9 to 13 with the same reference signs as in FIGS. 1 to 8, detailed description will be omitted in FIGS. 9 to 13 for simplicity.

The second embodiment differs from the first embodiment in that the connector of the second embodiment has a wedge-shaped recess portion 28B and a wedge-shaped projecting portion 19B.

The wedge-shaped recess portion 28B is provided heightwise on an inner surface of the protective bridge 28. The wedge-shaped projecting portion 19B is provided heightwise on an outer surface of the beam 19 so that the wedge-shaped projecting portion 19B slidably locks the wedge-shaped recess portion 28B in the mounting direction Y2.

Figure 9:
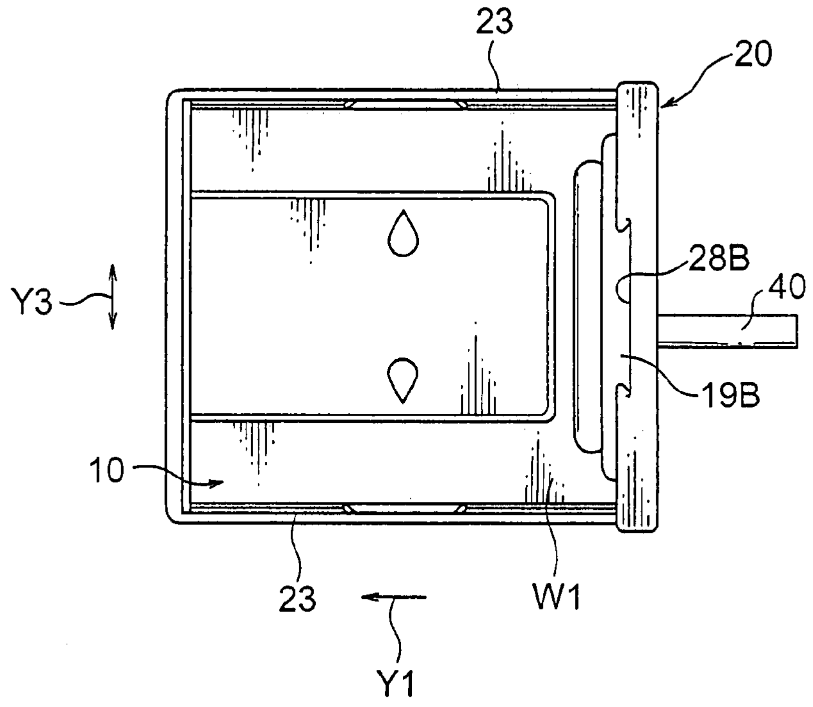
FIG. 9 is a bottom view of a connector according to the second embodiment.
Figure 10A:
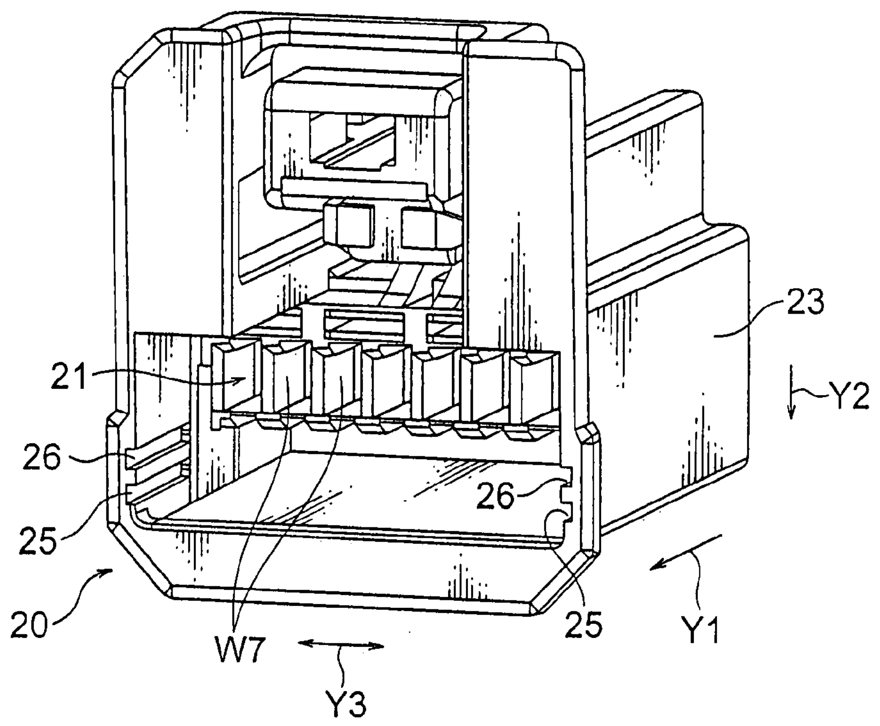
FIG. 10A is a top perspective view of an outer housing of the connector of FIG. 9.
Figure 10B:
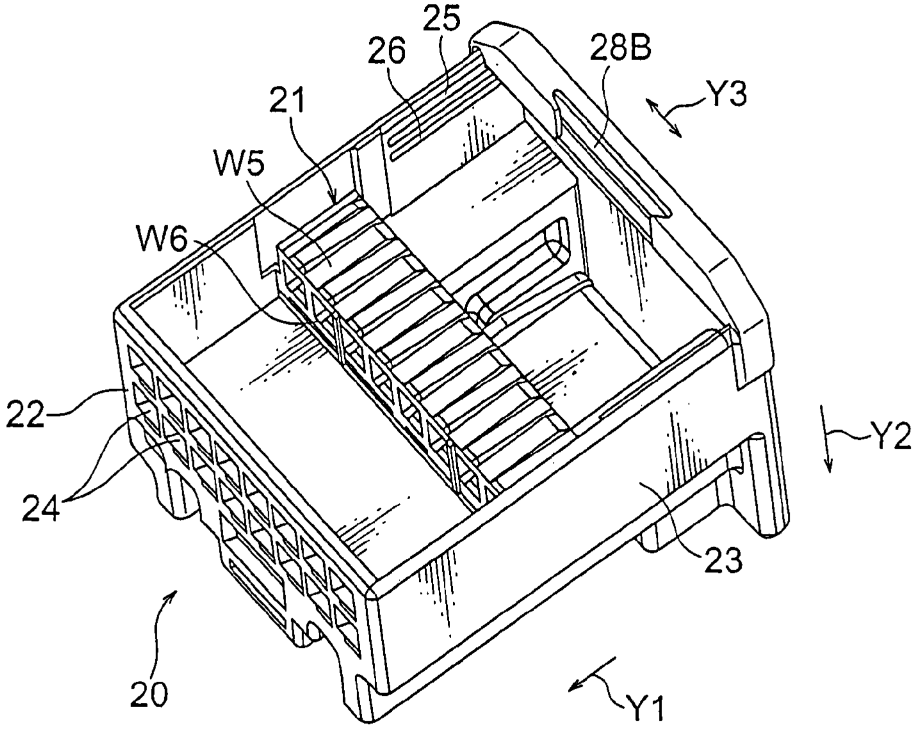
FIG. 10B is a bottom perspective view of the outer housing of the connector of FIG. 9.
Figure 11A:
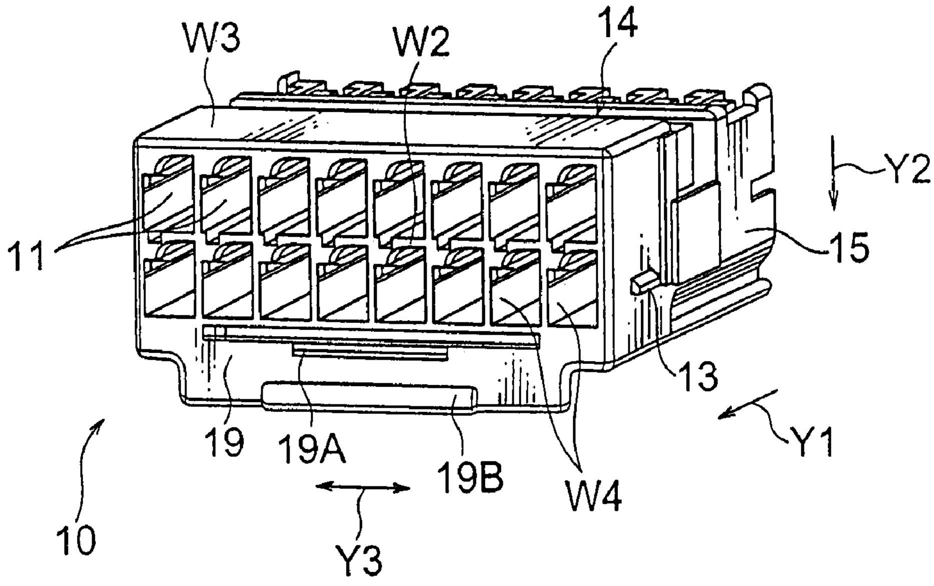
FIG. 11A is a top perspective view of an inner housing of the connector of FIG. 9.
Figure 11B:
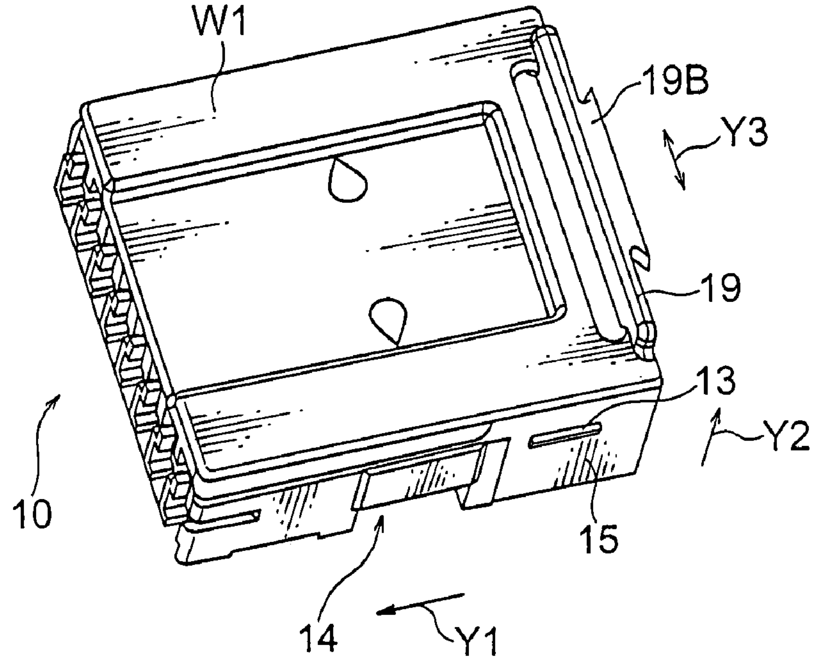
FIG. 11B is a bottom perspective view of the inner housing of the connector of FIG. 9.
Figure 12:
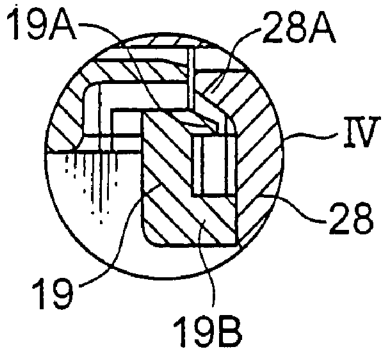
FIG. 12 is an enlarged view of circle IV of the connector according to the second embodiment.
Figure 13:
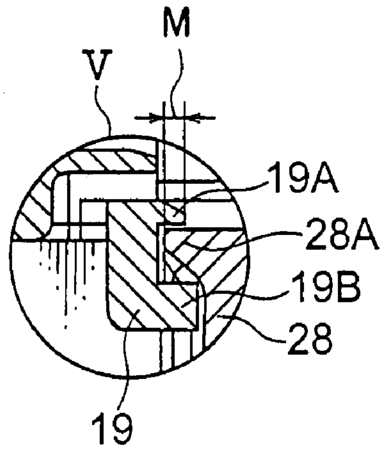
FIG. 13 is an enlarged view of circle V of the connector according to the second embodiment.

As shown in FIGS. 9 and 10, when advancing from the front part to the rear part of the outer housing and the inner housing, a width of both the recess portion 28B and the projecting portion 19B becomes smaller in the inserting direction Y1.

Given the configuration described above, a mechanism of locking between the wedge-shaped projecting portion 19B and the wedge-shaped recess portion 28B is as follows. The outer housing 20 is moved in the mounting direction Y2 and locked with inner housing 10 so that the spacer 21 of the outer housing 20 is inserted into the engagement groove 14 of the inner housing 10. As a result of the above operation, the wedge-shaped projecting portion 19B will be slidably locked with the wedge-shaped recess portion 28B in the mounting direction Y2.

A drawback of the first embodiment when compared with the second embodiment is that the beam 19 is elastically deformed prior to entry to the complete locking position between the first retaining protrusion 28A and the second retaining protrusion 19A. In the first embodiment, the deformed beam 19 causes a force that outwardly acts upon the protective bridge 28 in the inserting direction Y1. The force causes the protective bridge 28 to be deformed outwardly in the inserting direction Y1. When the protective bridge 28 is outwardly deformed, there remains no engagement margin (indicated by M in FIG. 13) between the first retaining protrusion 28A and the second retaining protrusion 19A.

In contrast, in the second embodiment, the wedge-shaped recess portion 28B and the wedge-shaped projecting portion 19B are provided whose widths in the width direction Y3 gradually increases toward the rear side in the inserting direction Y1. In other words, the widths of the wedge-shaped recess portion 28B and the wedge-shaped projecting portion 19B on the rear side of the inserting direction are larger than those on the front side in the inserting direction Y1. The above-described configuration allows the protective bridge 28 and the beam 19 to be kept locked with each other with respect to the inserting direction Y1, and the protective bridge 28 is protected against deformation, securing a given amount of the engagement margin. Thus, the inner housing 10 and the outer housing 20 can be maintained in the full locking more securely and reliably.

Figure 14A:
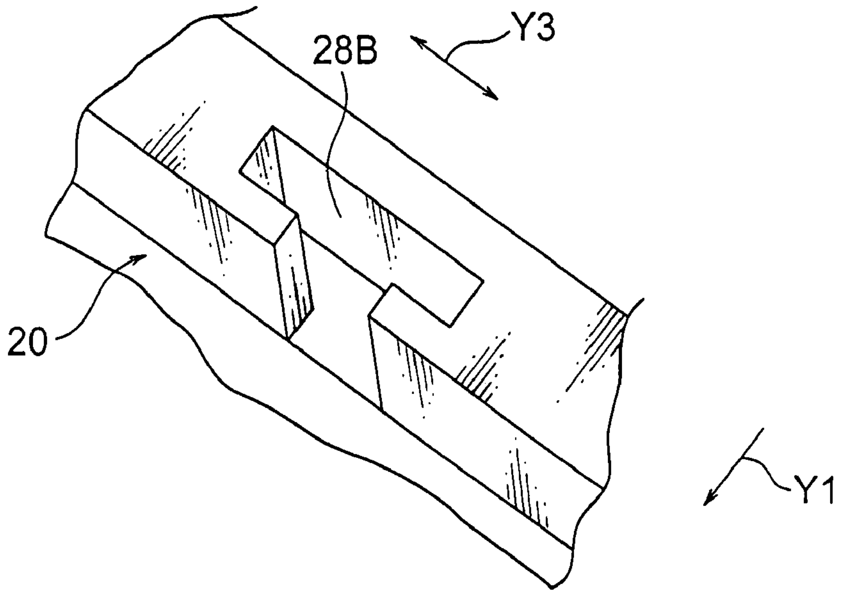
FIG. 14A is a partial enlarged view of a wedge-shaped recess portion according to another possible embodiment.
Figure 14B:
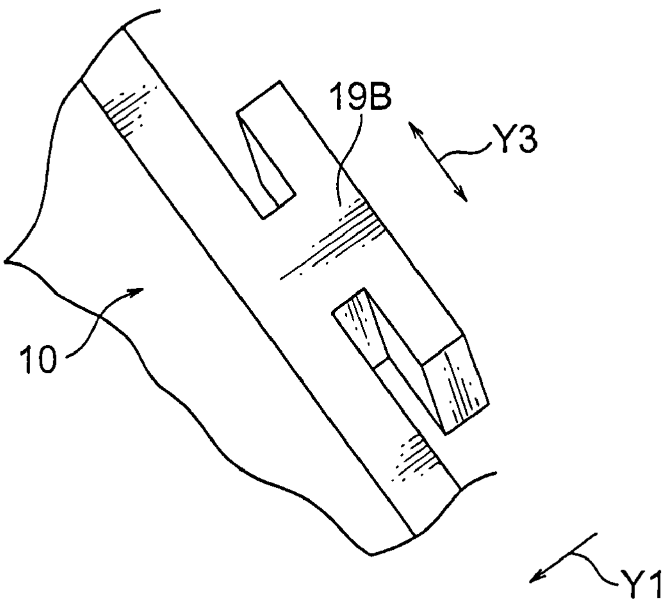
FIG. 14B is a partial enlarged view of a wedge-shaped projecting portion according to the embodiment in FIG. 14A.
Figure 15A:
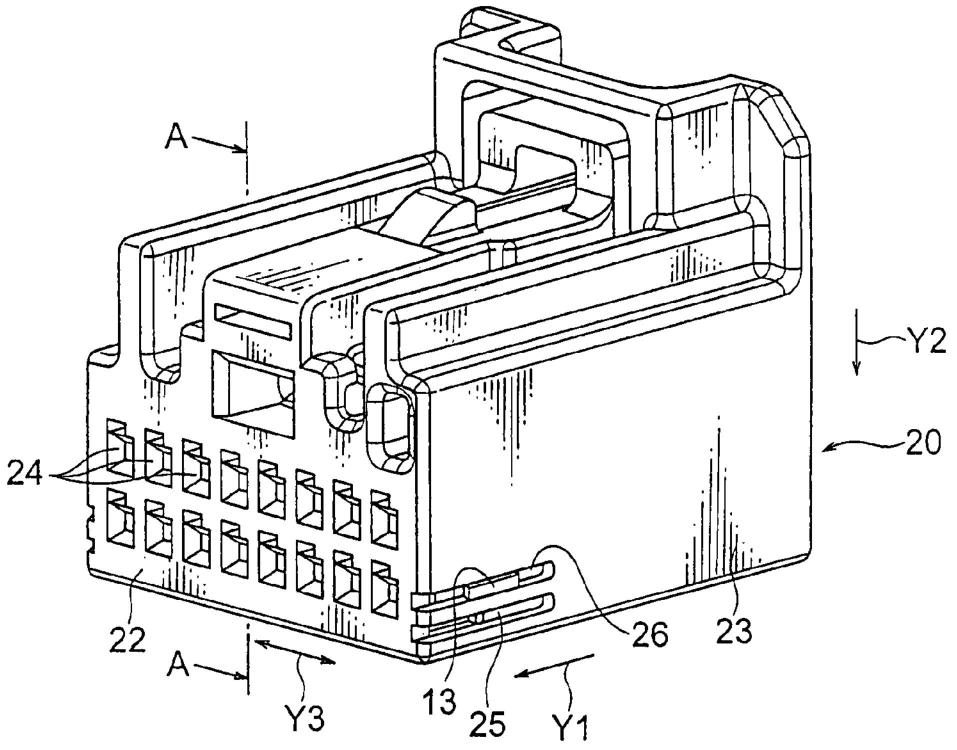
FIG. 15A PRIOR ART
FIG. 15A is a front perspective view of a conventional connector.
Figure 15B:
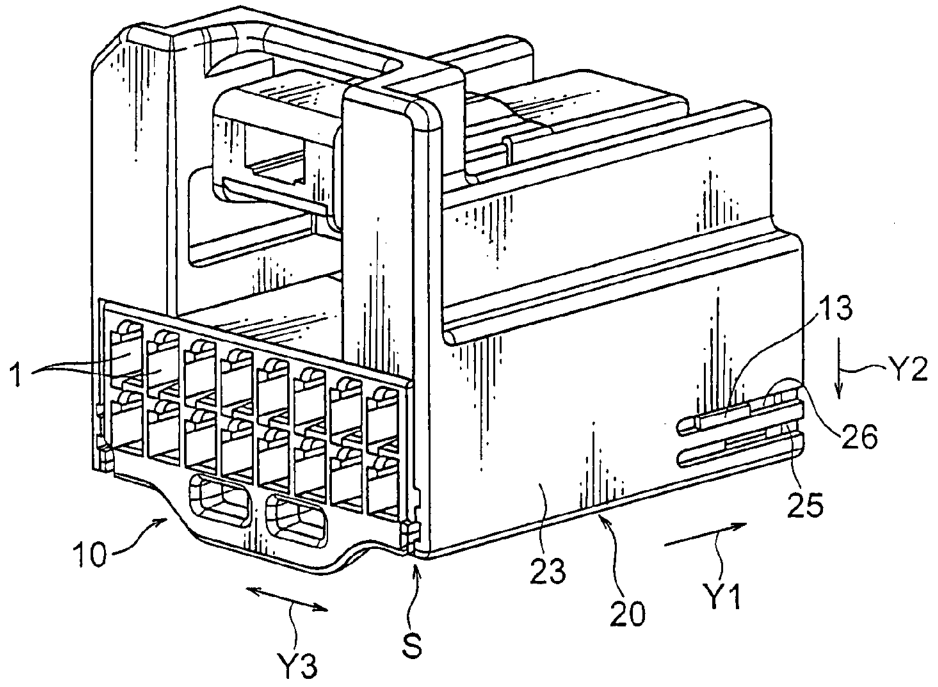
FIG. 15B PRIOR ART
FIG. 15B is a rear perspective view of the conventional connector of FIG. 15A.
Figure 16A:
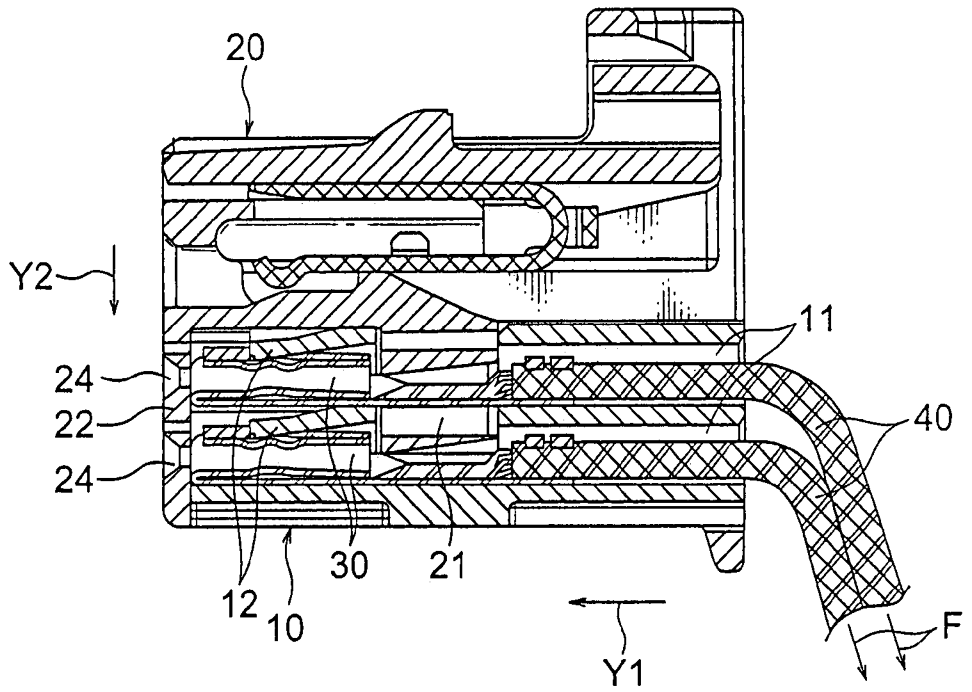
FIG. 16A PRIOR ART
FIG. 16A is a cross-sectional view taken along the line of A-A of the conventional connector of FIGS. 15A and 15B in a normal state.
Figure 16B:
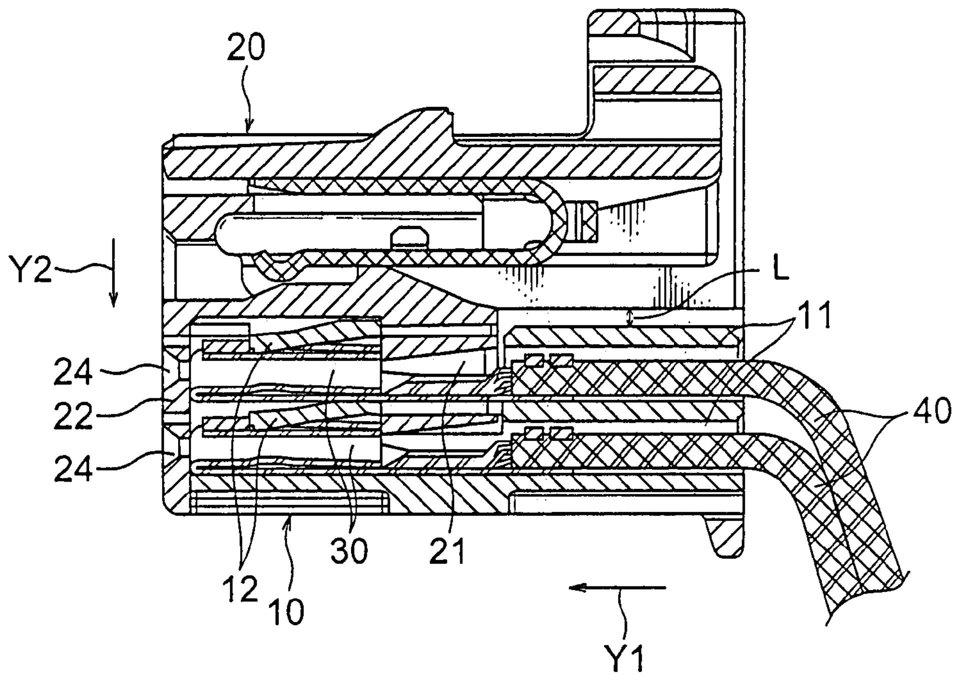
FIG. 16B PRIOR ART
FIG. 16B is a cross-sectional view taken along the line of A-A of the conventional connector of FIGS. 15A and 15B in an abnormal state.

In the second embodiment, the widths of the wedge-shaped recess portion 28B and the wedge-shaped projecting portion 19B in the width direction Y3 gradually increase form the distal side toward the proximal side in the inserting direction Y1. Other implementation is also possible insofar as the widths of the wedge-shaped recess portion 28B and the wedge-shaped projecting portion 19B nearer to the rear side in the inserting direction Y1 is larger than those nearer to the front side in the inserting direction Y1. FIGS. 14A and 14B show the recess portion and the projecting portion in another possible embodiment, respectively.

The first and second embodiments include the front portion 22 integrally formed with the outer housing 20. Other possible embodiment can include the front portion 22 that is provided separately from the outer housing 20.

The first and second embodiments also include the protective bridge 28 and the beam 19 respectively having the first retaining protrusion 28A and the second retaining protrusion 19A for locking in the complete locking position. Other possible embodiment can include, for example, a combination of one retaining protrusion on either one of the protective bridge 28 and the beam 19 and, on the other one of these two, one full locking groove engaging the retaining protrusion in the complete locking position.

Also, the first and the second embodiments include the beam 19 that is resilient in the inserting direction Y1. Other possible embodiments may include the protective bridge 28 resilient in the inserting direction Y1 instead of the resilient beam 19. Of course, both of the protective bridge 28 and the beam 19 can be resilient.

The second embodiment includes the protective bridge 28 having the wedge-shaped recess portion 28B and the beam 19 having the wedge-shaped projecting portion 19B. This of course does not exclude other possibilities of implementation. For example, a combination of the protective bridge 28 having the wedge-shaped projecting portion 19B and the beam 19 having the wedge-shaped recess portion 28B is also possible. In such an embodiment, the widths of the wedge-shaped projecting portion 19B and the wedge-shaped recess portion 28B in the width direction Y3 will gradually increase starting from the proximal side and advancing toward the distal side in the inserting direction Y1.

It should be noted that the embodiments described above are illustrated as examples of the possible embodiments of the present invention and that numerous modifications and variations can be effectuated within the spirit and scope of the present invention.

What is claimed is:

1. An electrical connector comprising:

(A) an inner housing having a terminal receiving chamber, and a terminal locking lance for locking a terminal received in said terminal receiving chamber, and a beam downwardly protruding in a mounting direction; and (B) an outer housing having a pair of side covers covering sides of said inner housing, a spacer to be locked with said inner housing at both of a provisional locking position where said terminal is allowed to be inserted into said terminal receiving chamber and a complete locking position where said terminal is locked so as to be prevented from coming off from said terminal receiving chamber, and a protective bridge provided in a rear part of said outer housing so as to connect the pair of said side covers with each other, wherein said outer housing is locked with said inner housing in a mounting direction crossing at right angles to an inserting direction along which said terminal is inserted into said inner housing; the protective bridge has a first retaining protrusion provided along a width direction; the beam has a second retaining protrusion along the width direction; the second retaining protrusion locks the first retaining protrusion in the complete locking position.

2. The electrical connector as set forth in claim 1, wherein said inner housing includes a locking mechanism provided in a rear part of said inner housing so as to lock said protective bridge of said outer housing at the complete locking position.

3. The electrical connector as set forth in claim 2, wherein said locking mechanism of said inner housing includes a locking projection protruding from the rear part of said inner housing in the inserting direction, a projecting portion is protrudingly provided from the rear part of said inner housing in the inserting direction, and said protective bridge of said outer housing includes a recess portion engaging said projecting portion of said inner housing, wherein a width of said projecting portion near to the rear part of said inner housing is larger than a width of said projecting portion near to a front part of said inner housing, and a width of said recess portion near to the rear part of said outer housing is larger than a width of said recess portion near to a front part of said outer housing.

* * * * *